United States Patent
Seitz et al.

(10) Patent No.: US 12,274,033 B2
(45) Date of Patent: Apr. 8, 2025

(54) APPARATUS COMPRISING A HEAT SINK FOR A PLUGGABLE MODULE

(71) Applicant: NOKIA SOLUTIONS AND NETWORKS OY, Espoo (FI)

(72) Inventors: Reinhold Seitz, Hilpoltstein (DE); Erwin Ruttmann, Petersaurach (DE)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 224 days.

(21) Appl. No.: 17/818,893

(22) Filed: Aug. 10, 2022

(65) Prior Publication Data
US 2023/0050895 A1 Feb. 16, 2023

(30) Foreign Application Priority Data
Aug. 12, 2021 (EP) .................................... 21190932

(51) Int. Cl.
*H05K 7/20* (2006.01)

(52) U.S. Cl.
CPC ....... *H05K 7/20409* (2013.01); *H05K 7/2049* (2013.01)

(58) Field of Classification Search
CPC .... H05K 7/20409; H05K 7/2049; H05K 7/10; H05K 7/1007; G02B 6/4261
See application file for complete search history.

(56) References Cited

U.S. PATENT DOCUMENTS

| | | | | |
|---|---|---|---|---|
| 7,033,202 B2 * | 4/2006 | Wu | ..................... | H01R 13/6215 439/362 |
| 7,036,574 B2 * | 5/2006 | Thompson | .......... | F28D 15/0233 165/185 |
| 7,090,519 B2 * | 8/2006 | Muramatsu | ........ | H01R 13/6335 439/159 |
| 7,470,139 B2 * | 12/2008 | Miki | ........................ | H04B 1/38 439/354 |
| 7,852,633 B2 * | 12/2010 | Ito | ........................ | H05K 5/0286 439/485 |
| 9,313,925 B2 * | 4/2016 | Kelty | ....................... | G06F 1/183 |
| 2005/0074995 A1 | 4/2005 | Kimura et al. | | |
| 2005/0215098 A1 | 9/2005 | Muramatsu et al. | | |
| 2022/0052474 A1 * | 2/2022 | Chiu | .................... | G02B 6/4261 |

FOREIGN PATENT DOCUMENTS

| | | | | |
|---|---|---|---|---|
| CN | 203353033 U | | 12/2013 | |
| CN | 106932865 A | * | 7/2017 | ............. G02B 6/426 |
| CN | 106932865 B | | 12/2018 | |

OTHER PUBLICATIONS

CN-106932865-A Translation (Year: 2019).*
European Search Report for EP Application No. 21190932.0 dated Feb. 4, 2022.

* cited by examiner

*Primary Examiner* — Mandeep S Buttar
*Assistant Examiner* — Matthew Sinclair Muir
(74) *Attorney, Agent, or Firm* — Kramer & Amado, P.C.

(57) ABSTRACT

An apparatus including: a base plate; a guide rail being disposed on the base plate; a sliding bar with a first side being disposed on the guide rail, wherein the sliding rail includes a wedge on a second side of the sliding bar opposite the first side; and a heat sink, wherein the base plate and the heat sink form a slot for insertion of a pluggable module at a front of the slot.

12 Claims, 9 Drawing Sheets

APPARATUS COMPRISING A HEAT SINK FOR A PLUGGABLE MODULE

CROSS-REFERENCE TO RELATED APPLICATIONS

This application claims benefit to European Patent Application No. EP 21190932 filed Aug. 12, 2021, the contents of which are hereby incorporated by reference for all purposes as if fully set forth herein.

TECHNICAL FIELD

Examples relate to communication technology, more specifically to an apparatus comprising a heat sink for a pluggable module.

BACKGROUND

Commonly known solutions for pluggable modules are with riding heat sinks. When the pluggable modules are inserted/extracted e.g., into a slot of a telecommunication subrack with is provided with a heat sink for the pluggable module, the friction force from the contact surface between the pluggable module and the heat sink must be overcome which might make insertion of the pluggable module into the slot and extraction of the pluggable module out of the slot difficult.

SUMMARY

Example embodiments of a first aspect of the disclosure disclose an apparatus which comprises a base plate, a guide rail, a sliding bar and a heat sink. The sliding bar comprises a wedge on an upper side of the sliding bar. The guide rail is disposed on the base plate. The sliding bar is disposed on the guide rail. The base plate and the heat sink form a slot for a pluggable module for insertion of the pluggable module at a front of the slot.

In an example embodiment of the first aspect, the sliding bar comprises an aperture for a thumb screw. The aperture may comprise an internal thread. The thumb screw may comprise an external thread. Screwing the thumb screw, more specifically the external thread of the thumb screw, into the aperture, more specifically into the internal thread of the aperture, causes the sliding bar to be pulled to the front.

In an example embodiment of the first aspect, the sliding bar and the guide rail are connected via a first spring. The first spring is horizontally positioned between a protuberance of the sliding bar and a cavity of the guide rail. Pulling the sliding bar to the front causes the first spring to be compressed.

In an example embodiment of the first aspect, opening the thumb screw, in particular by screwing the thumb screw out of the aperture, causes the sliding bar to be pushed away from the front.

In an example embodiment of the first aspect, opining the thumb screw, in particular by screwing the thumb screw out of the aperture, allows the first spring to extend. Extension of the first spring causes the sliding bar to be pushed away from the front.

In an example embodiment of the first aspect, the guide rail and the heat sink are connected via a second spring.

In an example embodiment of a first option of the first aspect, the heat sink comprises a retention cage for the second spring. The second spring is vertically positioned between a spring seat of the guide rail and the retention cage of the heat sink, i.e., the retention cage for the second spring. Pulling the sliding bar to the front causes the wedge to be moved sideward to a position not being below the retention cage thereby allowing the second spring to be extended. Extending of the second spring causes the heat sink to be pushed downward. Thereby the heat sink gets in contact with an upper surface of the pluggable module.

In an example embodiment of the first option of the first aspect, pushing the sliding bar away from the front causes the wedge to be moved sideward to a position below the retention cage of the heat sink. Thereby the heat sink is caused to be lifted and the slot is opened which enables extraction of the pluggable module out of the slot.

In an example embodiment of a second option of the first aspect, the second spring which is vertically positioned between the guide rail and a lower surface of a ramp-shaped protuberance of the heat sink. Pulling the sliding bar to the front causes the wedge of the sliding bar to be pulled over a lateral surface of the ramp-shaped protuberance of the heat sink. Thereby the heat sink is pulled downward and the heat sink gets in contact with the upper surface of the pluggable module.

In an example embodiment of a second option of the first aspect, pulling the heat sink downward causes the second spring to be compressed.

In an example embodiment of a second option of the first aspect, opening the thumb screw, in particular by screwing the thumb screw out of the aperture, allows the first spring to extend. Extension of the first spring causes the sliding bar to be pushed away from the front. Pushing the sliding bar away from the front causes the wedge of the sliding bar to be pushed away from the lateral surface of the ramp-shaped protuberance of the heat sink thereby allowing the second spring to extend. Thereby the heat sink is lifted and the slot is opened which enables extraction of the pluggable module out of the slot.

Example embodiments of a second aspect of the disclosure disclose an apparatus which comprises a base plate, a rod and a heat sink. The heat sink is disposed on the rod, and the heat sink and the base plate form a slot for mounting a pluggable module into the slot.

In an example embodiment of the second aspect, turning the rod around its longitudinal axis causes the heat sink to be lifted thereby opening the slot which enables insertion and/or extraction of the pluggable module at a front of the slot.

In an example embodiment of the second aspect, the rod comprises a section including a cam which reduces a cross-sectional area of the rod. At the section including the cam the rod is disposed on a spring seat of the base plate, and a spring is disposed between the spring seat of the base plate and a retention cage of the heat sink.

In an example embodiment of the second aspect, the rod comprises a knob. Turning the rod around its longitudinal axis until the knob points to a first direction causes the cam to be at a lateral position thereby increasing the thickness of the rod where the rod is disposed on the spring seat of the base plate up to the full cross-sectional area of the rod thereby causing the spring to be compressed while lifting the heat sink. Thereby the slot is opened which enables insertion and/or extraction of the pluggable module at the front of the slot.

In an example embodiment of the second aspect, the rod comprises a knob. Turning the rod around its longitudinal axis until the knob points to a second direction causes the cam to be at a lower position thereby decreasing the thickness of the rod where the rod is disposed on the spring seat of the base plate up to a thickness corresponding to the full cross-sectional area of the rod minus a depth of the cam which allows the spring to extend. Thereby the heat sink is pulled downward and the heat sink is caused to be in close contact with an upper surface of the pluggable module being inserted into the slot.

It is to be understood that the summary section is not intended to identify key or essential features of embodiments of the present disclosure, nor is it intended to be used to limit the scope of the present disclosure. Other features of the present disclosure will become easily comprehensible through the following description.

BRIEF DESCRIPTION OF THE DRAWINGS

The teaching herein can be readily understood by considering the following detailed description of some example embodiments in conjunction with the accompanying drawings, in which.

DETAILED DESCRIPTION

Figure 1:
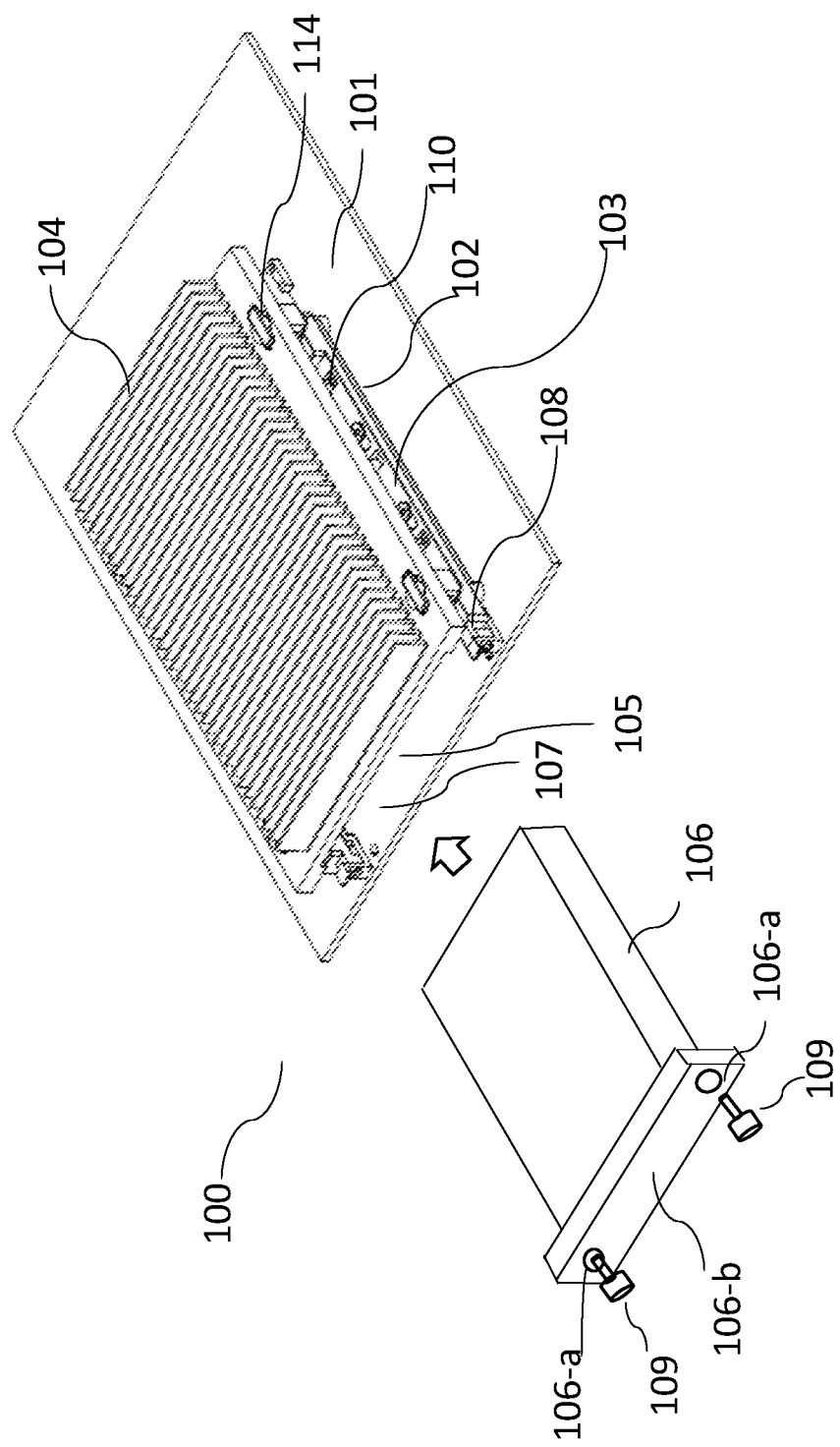
FIG. 1 schematically depicts a perspective view of an apparatus according to a first option of a first aspect of the disclosure.

Principles of the present disclosure will now be described with reference to some example embodiments. It is to be understood that these embodiments are described only for the purpose of illustration and help those skilled in the art to understand and implement the present disclosure, without suggesting any limitation as to the scope of the disclosure. The disclosure described herein can be implemented in various manners other than the ones described below. In the following description and claims, unless defined otherwise, all technical and scientific terms used herein have the same meaning as commonly understood by one of ordinary skills in the art to which this disclosure belongs.

References in the present disclosure to "one embodiment", "an embodiment", "an example embodiment", and the like indicate that the embodiment described may include a particular feature, element, structure, or characteristic, but it is not necessary that every embodiment includes the particular feature, element, structure, or characteristic. Moreover, such phrases are not necessarily referring to the same embodiment. Further, when a particular feature, element, structure, or characteristic is described in connection with an embodiment, it is submitted that it is within the knowledge of one skilled in the art to affect such feature, element, structure, or characteristic in connection with other embodiments whether or not explicitly described. Further, some features or elements might be omitted in the drawings for simplicity. However, it is submitted that one skilled in the art understands that those features or elements might be present.

It shall be understood that although the terms "first" and "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the listed terms.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof. The following example embodiments are only for illustrative reasons. The scope of the disclosure is defined in the claims.

Figure 2:
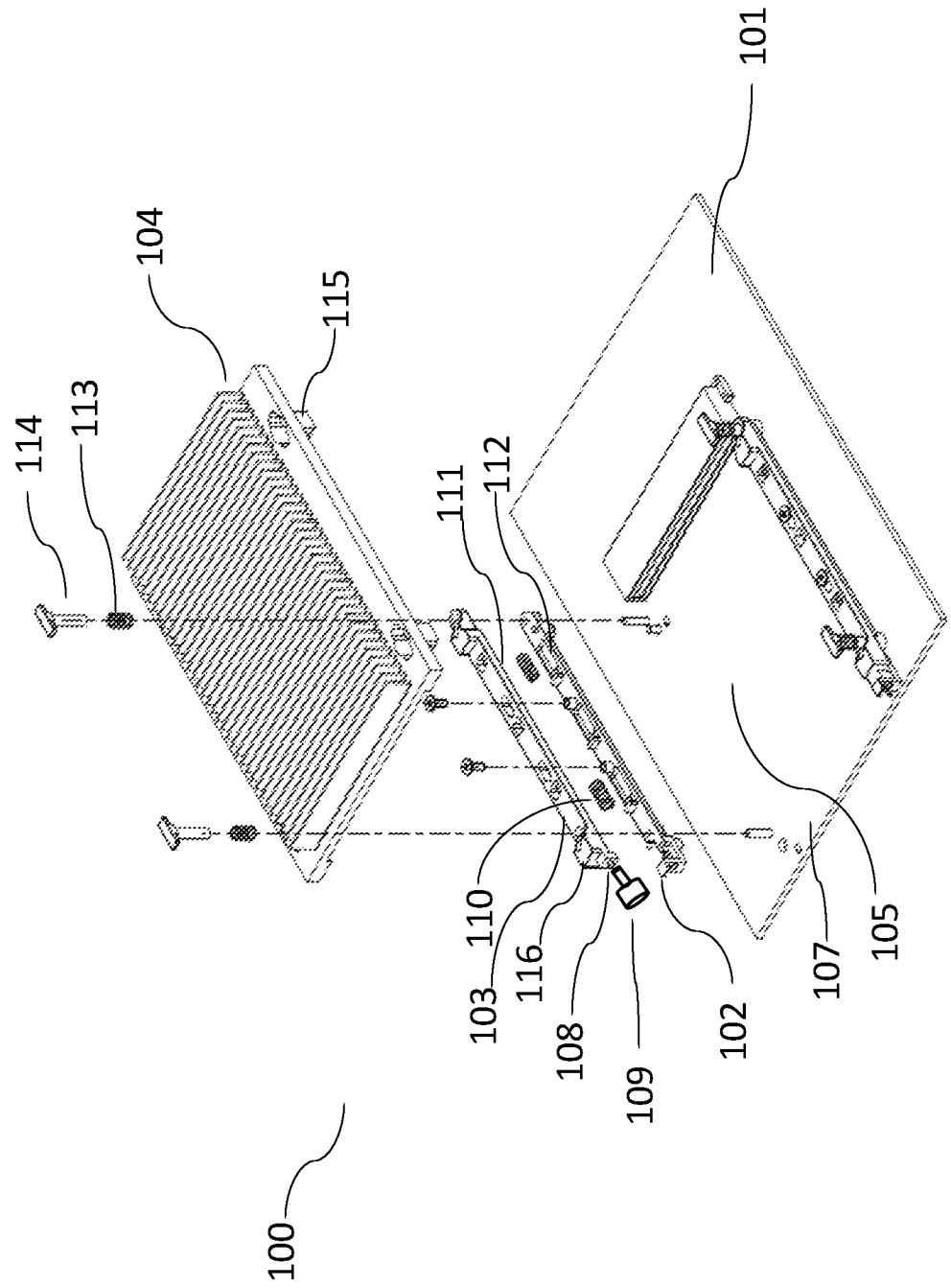
FIG. 2 schematically depicts a perspective, exploded view of an apparatus according to the first option of the first aspect of the disclosure.
Figure 3:
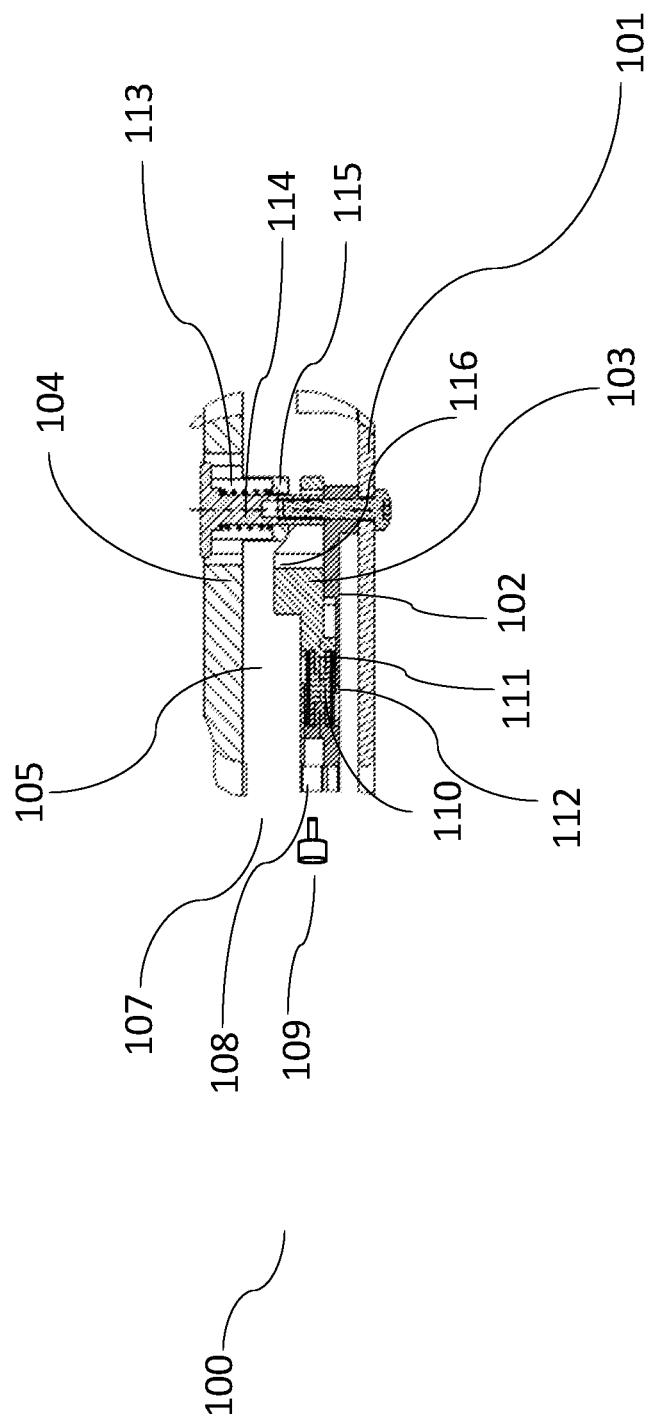
FIG. 3 schematically depicts a partial cross-section side view of an apparatus according to the first option of the first aspect of the disclosure.

FIG. 1 and FIG. 2 schematically depict a perspective view of an apparatus 100 according to a first option of a first aspect of the disclosure, wherein FIG. 2 is an exploded view. Further, in FIG. 1, a pluggable module 106 is shown. The pluggable module 106 is not part of the apparatus 100. Rather, the pluggable module 106 might be inserted in and mounted in the apparatus 100, or—in other words—the apparatus 100 might be used for insertion and/or mounting the pluggable module 106 into the apparatus 100. FIG. 3 schematically depicts a partial cross-section side view of an apparatus 100 according to the first option of the first aspect of the disclosure. More specifically, FIG. 3 shows in enlarged scale a portion of the front right edge of the apparatus 100 depicted in FIGS. 1 and 2. Since some elements of the apparatus 100 are only or at least better shown on one of the FIGS. 1 to 3, the reader may refer to FIGS. 1 to 3 in parallel to appreciate the functioning of the apparatus 100 according to the first option of the first aspect of the disclosure.

The apparatus 100 is used for mounting a pluggable module 106 (e.g., an optical pluggable module) into the apparatus 100. FIG. 1 shows where (or in other words in which direction) the pluggable module 106 is inserted at the front 107 of a slot 105 which is formed by the apparatus 100 (in particular by and between the base plate 101 and the heat sink 104). Correspondingly, when the pluggable module 106 is extracted out of the apparatus 100, the pluggable module 106 is pulled out of the slot 105 of the apparatus 100 in the inverse direction (the extraction is not depicted). Generally speaking, it might be said that the main function of the apparatus 100 is to hold the pluggable module 106 inside the apparatus 100 and to conduct the heat which is caused by the pluggable module 106 away from the pluggable module

106. Therefore, the apparatus 100 comprises a heat sink 104 with which the pluggable module 106 when inserted into the apparatus 100 gets in close contact. Actually, when the pluggable module 106 is operated, heat will be generated by and in the pluggable module 106 (e.g., by electric current flowing through the pluggable module 106). The heat must be conducted away from the pluggable module 106 in order to keep the pluggable module 106 in good functioning. As mentioned, once inserted into the apparatus 100, the pluggable module 106 is in close contact to the heat sink 104. However, due to this close contact between the heat sink 104 and the pluggable module 106, the friction force between the lower side of the heat sink 104 and the upper side of the pluggable module 106 would be very high and would make insertion and extraction of the pluggable module 106 constraining, if the heat sink were built in a rigid manner, this means were not flexible or movable at all. Therefore, the apparatus 100, and in particular the heat sink 104, is built in a way which allows lifting the heat sink 104 when the pluggable module 106 is inserted into the apparatus 100 (and likewise when the pluggable module 106 is extracted out of the apparatus 100). By lifting the heat sink 104 upward (away from the pluggable module 106), the slot 105 of the apparatus 100 is larger and therefore insertion and/or extraction of the pluggable module 106 is enabled and/or (at least) facilitated. Thus, FIG. 1 shows the apparatus 100 in a not-lifted position of the heat sink 104, e.g., before the pluggable module 106 is actually inserted. However, as mentioned, FIG. 1 illustrates already in which direction the pluggable module 106 will be inserted into the apparatus 100, more specifically into the slot 105, and even more specifically at the front 107 of the slot 105 into the slot 105 of the apparatus 100. Further (although not depicted explicitly), the apparatus 100 would look similar as depicted in FIG. 1 (with the heat sink 104 in non-lifted position), after the pluggable module 106 would actually have been mounted into the apparatus 100, this means after insertion of the pluggable module 106 into the apparatus 100 and after the heat sink 104 would not be lifted any more, (but be in close contact with the pluggable module 106 to conduct away the heat generated by and in the pluggable module 106). Of course, once the pluggable module 106 is mounted into the apparatus 100, the pluggable module 106 is mainly inside the apparatus 100, and in particular the front plate 106-b of the pluggable module 106 is at the front 107 of the apparatus 100.

For appreciating the elements of which the apparatus 100 is composed of, the reader might refer in particular to FIG. 2 which shows an exploded view of the apparatus 100. The apparatus 100 comprises a base plate 101, a guide rail 102, a sliding bar 103 and a heat sink 104. The sliding bar 103 comprises a wedge 116 on an upper surface of the sliding bar 103. The wedge 116 in the apparatus according to the first option of the first aspect may have the shape of a ramp, and may therefore by termed ramp 116, or mechanical ramp 116. The guide rail 102 is disposed on the base plate 101. The guide rail 102 is stably mounted on the base plate 101. The guide rail 102 is not movable. The sliding bar 103 is disposed on the guide rail 102. The sliding bar 103 is movable in the sense that the sliding bar 103 is able to slide on the guide rail 102. The base plate 101 and the heat sink 104 form a slot 105 for a pluggable module 106 for insertion of the pluggable module 106 into the apparatus 100, in particular into the slot 105 of the apparatus 100, more specifically at the front 107 of the slot 105.

As depicted in FIG. 2, some elements are present not only once, but two or more times. However, in the claims, some of those elements are defined only once. This is, because it might technically be implementable that the functioning of the apparatus 100 is achieved by a smaller number of those elements than depicted in the FIGS. Therefore, to keep the scope of protection large, in the claims, the singular form might be used, although in some of the FIGS. the respective element appears more than once. For example, FIG. 2 shows that the exemplary apparatus 100 comprises two guide rails 102, namely at each lateral side of the apparatus 100. Similarly, some elements, e.g., the sliding bar 103, which are implemented in connection with a guide rail 102, are present more than once. For example, FIG. 2 shows that similar as (the exploded presentation of) the guide rail 102/sliding bar 103 construction at the left lateral side of the apparatus 100 (from the perspective of the front 107), on the right lateral side of the apparatus 100, a same guide rail 102/sliding bar 103 construction is implemented. Therefore, the implementation such as depicted in the FIGS. might be one possible implementation of the apparatus 100.

However, as the skilled person would appreciate, the functioning of the apparatus 100 might be possible by further implementations having less of some of the elements shown in the FIGS. For example, the lifting of the heat sink 104 might be achieved by only one guide rail 102/sliding bar 103 construction at one of the right or left side of the apparatus 100 which might be sufficient to realize lifting of the heat sink 104 for insertion and extraction of the pluggable module 106. In the case of only one guide rail 102/sliding bar 103 construction on one lateral side of the apparatus 100, on the other side of the apparatus 100, some kind of hinge might be implemented, which would allow lateral lifting of the heat sink 104 by using the lifting mechanism realized by the guide rail 102/sliding bar 103 construction on one side which in this case would be a lateral lifting of the heat sink 104, while on the other lateral side of the apparatus 100 by the hinges the heat sink 104 would be rotatably connected to the base plate 101.

However, in the following, it is assumed that the example apparatus 100 is implemented by a guide rail 102/sliding bar 103 construction on both the right and left lateral side of the apparatus 100, and therefore further elements connected with such a guide rail 102, sliding bar 103 construction might also be present in multiplicity (such as for illustrative reasons shown in one or more of the FIGS). Therefore, in case in the following the functioning is described with reference to one element in the singular form, it might be appreciated that the element is present more than once such as exemplary presented in the FIGS., even if this is not explicitly stated.

For example, in the following, the functioning is described with reference to "a" sliding bar 103 using the singular form. However, such as shown in e.g., FIG. 2, the exemplary apparatus 100 comprises both a sliding bar 103 at the right lateral side of the apparatus 100 and a sliding bar 103 at the left lateral side of the apparatus 100, and what is described herein with reference to "a sliding bar 103" or "the sliding bar 103", applies similarly to the other sliding bar 103 of the two sliding bars 103 present in the exemplary apparatus 100 shown in the FIGS.

In an example embodiment, the sliding bar 103 comprises an aperture 108 for a thumb screw 109. By screwing the thumb screw 109 into the aperture 108, more specifically into the internal thread of the aperture 108, the sliding bar 103 is pulled to the front 107. For this functioning, the reader might refer in particular to FIG. 3 which shows an enlarged view of the right front edge of the apparatus 100 (from the perspective used in FIGS. 1 and 2). When the screw 109 is screwed into the aperture 108, the external thread of the thumb screw 109 is screwed into the internal thread of the aperture 108. Due to the implementation of the external thread of the thumb screw 109 and the internal thread of the aperture 108, the sliding bar 103 is pulled in the direction of the front 107 when the thumb screw 109 is screwed into the aperture 108. Thereby, as will be described in more detail in the following, the heat sink 104 is allowed to get in contact with a pluggable module 106 inserted into the apparatus 100.

Therefore, by screwing the thumb screw 109 into the aperture 108, the inserted pluggable module 106 is in a stable position in the apparatus 100, this means after insertion of the pluggable module 106. In particular, as depicted in FIG. 1, the thumb screw 109 might be put through a hole 106-a in a front plate 106-b of the pluggable module 106. Thereby and by the heat sink 104 having close contact to the pluggable module 106, the pluggable module 106 is mounted into the apparatus 100 after insertion of the pluggable module 106 into the apparatus 100. Thus, it is noted, that the thumb screw 109 (and screwing the thumb screw 109 into the apparatus 108) has a double function: Screwing the thumb screw 109 (through the hole 106-a of the front plate 106-b of the pluggable module 106) into the aperture 108 fixes the pluggable module 106 into the apparatus 100, and—in particular simultaneously—causes the heat sink 104 to be moved downwards getting in close contact with the pluggable module 106. This kind of automatism makes insertion (and extraction) of the pluggable module 106 easy and safe (and at this occasion should be mentioned as an advantage of the present disclosure).

As will be described in more detail below, when the thumb screw 109 is screwed out of the aperture 108, the sliding bar 103 is moved away from the front 107. Thereby, the heat sink 104 is lifted (by the mechanism described in the following).

Therefore, shortly spoken, screwing the thumb screw 109 into the aperture 108 brings the pluggable module 106 in a firmly mounted position in the apparatus 100 (heat sink 104 in close contact with the pluggable module 106), and screwing the thumb screw 109 out of the aperture 108 causes the heat sink 104 to be lifted thereby enabling insertion and/or extraction of the pluggable module 106. In this context, the wording "enabling insertion and/or extraction" of the pluggable module 106 means that due to the lifted heat sink 104, the friction force between the heat sink 104 and the pluggable module 106 is null (no contact between heat sink 104 and pluggable module 106), and the insertion and/or extraction of the pluggable module 106 is possible with (nearly) no force. Therefore, the mechanism described herein might be termed "zero-force insertion and/or extraction for pluggable modules via lifting heat sink".

As exemplary depicted e.g., in FIG. 1, the sliding bar 103 and the guide rail 102 are connected via a first spring 110 (actually, the first spring 110 is present two times at each of the guide rail 102/sliding bar 103 construction, this means overall the first spring 110 is present four times in the exemplary implementation shown herein, this means there are four "first springs 110", namely a respective one at each (front/rear) end of each (right/left) guide rail 102/sliding bar 103 construction. The first spring 110 is horizontally positioned between a protuberance 111 of the sliding bar 103 and a cavity 112 of the guide rail 102. Pulling the sliding bar 103 to the front 107 causes the first spring 110 to be compressed. The protuberance 111 of the sliding bar 103 and the cavity 112 of the guide rail 102 are made to firmly hold the first spring 110 between the sliding bar 103 and the guide rail 102, wherein firmly hold in regard of the first spring 110 means that the first spring 110 is kept between the sliding bar 103 and the guide rail 102. However, the first spring 110 (while being "firmly hold" between sliding bar 103 and guide rail 102) is allowed to be compressed and/or to be extended.

It is noted that alternatively to the term "protuberance", the term "protrusion" might be used. Further, alternatively to the term "be extended" to term "extend" or "expand" might be used, where appropriate (and inversely). Similarly, alternatively to the term "extension" the term "expansion" might be used, where appropriate (and inversely).

In the present example, the mechanism how it is described so far, is that the thumb screw 109 is screwed (e.g., through the hole 106-a at the front plate 106-b of the pluggable module 106 into the aperture 108) which pulls the sliding bar 103 in direction of the front 107 of the apparatus 100. This is possible, because the sliding bar 103 is movable disposed on the guide rail 102. When the sliding bar 103 is pulled to the front 107, the first spring 110 is compressed.

This means, the sliding bar 103 is pulled against the spring force of the first spring 110 to the front 107.

Further, as a preview to the lifting mechanism, in the exemplary apparatus 100, when the thumb screw 109 is opened, this means when the thumb screw 109 is screwed out of the aperture 108, the sliding bar 103 is pushed away from the front 107. More specifically, when the thumb screw 109 is opened (screwed out of the aperture 108), the first spring 110 is allowed to extend. Extension of the first spring 110 causes the sliding bar 103 to be pushed away from the front 107. This means, by the spring force (of the first spring 110) which is generated by previous compression of the first spring 110, the sliding bar 103 is pushed away from the front 107 (as soon as the thumb screw 109 is screwed out of the aperture 108).

In the following, it will be exemplarily described, how pulling the sliding bar 103 to the front 107 (by screwing the thumb screw 109 against the spring force of the first spring 110 into the aperture 108) causes the heat sink 104 to be pulled downward getting in close contact with the inserted pluggable module 106, and further how pushing (by the spring force of the first spring 110) the sliding bar 103 away from the front 107 (when screwing the thumb screw 109 out of the aperture 108) causes the heat sink 104 to be lifted enabling ("zero-force") insertion and/or extraction of the pluggable module 106.

In an example apparatus 100 depicted in FIGS. 1 to 3, the guide rail 102 and the heat sink 104 are connected via a second spring 113. Illustratively, as shown in FIG. 1, the second spring 113 is present not only once, but four times, at each (front/rear) end of each (right/left) guide rail 102/ sliding bar 103 construction (thus there are four "second springs 113", although in the following the functioning is described with reference to the second spring 113 using the singular form, nevertheless this explanation might apply to each of the "second springs 113" similarly).

The second spring 113 is vertically positioned between spring seat 114 of the guide rail 102 and a retention cage 115 for the second spring 113, wherein the retention cage 115 for the second spring 113 is a part of the heat sink 104. Alternatively to the term "spring seat", the term "spring holder" may be used. FIG. 3 shows a cross-sectional view of the spring seat 114 of the guide rail 102. The spring seat 114 might be regarded as protuberance of the guide rail 102, wherein said protuberance is to hold the second spring 113, in the sense that the second spring 113 loops (or entangles) around the vertical part of the spring seat 114. In FIG. 3, the spring seat 114 of the guide rail 102 is connected not only to the guide rail 102, but also, namely through the guide rail 102, with the base plate 101. (e.g., via a hole in the guide rail 102). Thereby, the spring seat 114 of the guide rail 102 functions also as a fixation of the guide rail 102 at the base plate 101. Alternatively, the spring seat 114 of the guide rail 102 might (only) be connected with the guide rail 102 without extending through the guide rail 102 to the base plate 101 (and the guide rail 102 might be fixed to the base plate 101 by separate fixation (e.g., further fixation screws). In either case, the spring seat 114 of the guide rail 102 is not movable. This means, while the heat sink 104 is movable in the sense that it is able to be moved downward and/or lifted, respectively, the spring seat 114 of the guide rail 102 does not move. Similarly, while the sliding bar 103 is movable in the sense that the sliding bar 103 is able to be pulled to the front 107 and/or pushed away from the front 107, the spring seat 114 of the guide 102 (and also the guide 102 as a whole) does not move (this means is not movable).

Further, the spring seat 114 has an upper fixation for the second spring 113. In particular, said upper fixation for the second spring 113 is implemented by the shape of the upper part of the spring seat 114. E.g., as illustratively depicted in FIG. 3, it can be seen that the spring seat 114 may have a "T-shape", and in particular, it is noted that the "T-shape" form of the spring seat 114 is made to build an upper fixation for the second spring 113. Similarly, the retention cage 115 of the heat sink 104, is implemented in the depicted shape (as shown e.g. in FIG. 3) to build a lower fixation for the second spring 113. For example, in the illustrative implementation as depicted of FIG. 3, the retention cage 115 might have the form of a pair of an L-shaped protuberance and of a mirrored L-shaped protuberance of the heat sink 104. "Fixation" of the second spring 113 means that the second spring 113 is kept between the spring seat 114 of the guide rail 102 and the retention cage 115 of the heat sink 104. However, nevertheless the second spring 113 is able to be compressed and/or to extend. As might be best seen at FIG. 3, the retention cage 115 of the heat sink 104 forms a (kind of a) cage in and/or through which the spring seat 114 of the guide rail 102 is disposed. Further, the second spring 113 is a kind of connection between the spring seat 114 of the guide rail 102 (and thereby of the guide rail 102 itself) and of the retention cage 115 for the second spring 113, and—since the retention cage 115 is part of the heat sink 104—therefore of the heat sink 104 itself. However, this "connection" by the second spring 113 is not "fix" in the sense of not movable (or—in other words—in the sense of being totally rigid), but the second spring 113 is able to be compressed and/or to extend. Actually, when the second spring 113 is allowed to extend, the second spring 113 pushes the heat sink 104 downward: the second spring 113 on the upper end leans against the spring seat 114 which is not movable. Therefore, by the spring force of the second spring 113 (assuming that the second spring 113 has previously been compressed), the second spring 113 implements a force on the inner lower side of the retention cage 115 of the heat sink 104 and pushes the retention cage 115 of the heat sink 104 downward. Since the retention cage 115 of the heat sink 104 is rigidly connected with the heat sink 104 (or is even a part of the heat sink 104), pushing the retention cage 115 downward means that the heat sink 104 is pushed downward. This means, conclusively, the (spring force of the previously compressed) second spring 113 pushes the heat sink 104 downward, once the second spring 113 is allowed to extend.

In the following, it will be illustratively described, how the second spring 113 is compressed and—"inversely"—how the second spring 113 is allowed to extend.

As illustratively shown e.g., in FIGS. 2 and 3, the sliding bar 103 comprises a wedge 116 on an upper side of the sliding bar 103 (more specifically each sliding bar 103 might have two wedges 116 and associated construction, and description related to "a" wedge 116 applies to each of the wedges 116 similarly). In the apparatus described with reference to FIGS. 1 to 3, the wedge 116 might have the shape of a ramp. Thus, alternatively to the term "wedge 116", the wedge 116 might be termed "ramp 116", or further alternatively "mechanical ramp 116". Pulling the sliding bar 103 to the front 107 causes the wedge 116 to be moved sideward to a position not being below the retention cage 115 thereby allowing the second spring 113 to be extended. As mentioned above, extending the second spring 113 causes the heat sink 104 to be pushed downward causing the heat sink 104 to get in close contact with the upper surface of the pluggable module 106 (and allowing heat transfer from the pluggable module 106 to the heat sink 104). In more detail, when the thumb screw 109 is screwed into the aperture 108 (in particular, the outer thread of the thumb screw 109 is screwed into the inner thread of the aperture 108), the sliding bar 103 is pulled (against the spring force of the first spring 110) in direction of the front 107 (in FIG. 2 frontwards, in FIG. 3 to the left side). Thereby, the wedge 116 which is part of the sliding bar 103 is moved also frontwards in FIG. 2, this means to the left in FIG. 3. Thereby, the wedge 116 is not directly under (below) the retention cage 115 of the heat sink 104. In other words, since the wedge 116 is moved away, the wedge 116 does not hinder the retention cage 115 of the heat sink 104 (and therefore the heat sink 104 itself) any more to be pushed downward by the spring force of the (previously compressed) second spring 113.

Thus, conclusively, mounting the pluggable module 106 into the apparatus 110 is made by—in short words: (after having put the pluggable module 106 into the slot 105) screwing the thumb screw 109 into the (inner thread of the) aperture 108, pulling thereby the sliding bar 103 to the front 107, thereby moving the wedge 116 of the sliding bar 103 away from the position directly below the retention cage 115 of the heat sink 104, thereby allowing the second spring 113 to extend thereby pushing (by the second spring 113) the heat sink 104 downward getting in close contact with the inserted pluggable module 106.

Further, it is noted that it is possible that the wedge 116 does not have to and therefore is not completely moved away from (the position directly below) the retention cage 115 of the heat sink 104, before the heat sink 104 gets in contact with the pluggable module 106 inserted into the slot 105. This is, because once the heat sink 104 gets in close contact with the pluggable module 106, the heat sink 104 cannot get downward further. Due to the inclined shape of the wedge 116 shown e.g., in FIG. 3, the wedge 116 allows, when moved sideward, the heat sink 104 to get downward until the heat sink 104 gets in contact with the pluggable module 106. Depending on the height of the pluggable module 106, the heat sink 104 gets more or less downward and therefore more or less of the inclined part of the wedge 116 is used to bring the heat sink 104 downward (this means, the wedge 116 may be moved away completely, or only partly in case the retention cage 115 gets on the inclined part of the wedge 116 deep enough downwards to get in close contact with the pluggable module 106. Thereby, the slot 105 fits to pluggable modules 106 having different heights, in either case enabling close contact of the heat sink 104 with the pluggable module 106. The heat sink 104 gets downward along the inclined portion of the wedge 116 (the wedge 116 being moved/moving sidewards following the sliding of the sliding bar 103 being pulled to the front 107) until the heat sink 104 gets in close contact with the pluggable module 106. With increasing height of a pluggable module 106 (different pluggable modules 106 might have different heights), the heat sink 104 will get less far downward, and thus a smaller part of the inclined portion of the wedge 116 is actually used to get the heat sink 104 downward until the heat sink 104 reaches its lowest position given (predetermined) by the height of the pluggable module 106 inserted into the slot 105.

In the following, it will illustratively be described, how the heat sink 104 is lifted, and further how the second spring 113 is compressed (resulting in said "previously compressed" state of the second spring 113 mentioned above).

In the example apparatus 100 described with reference to FIGS. 1 to 3, when the thumb screw 109 is opened, in particular screwed out of the aperture 108, the sliding bar 103 is by (the spring force of the previously compressed) first spring 110 pushed away from the front 107, this means to the rear in FIG. 2 and to the right in FIG. 3. When the sliding bar 103 is pushed away from the front 107 (e.g., to the right in FIG. 2), the wedge 116 is moved sideward to a position below the retention cage 115 of the heat sink 104. In particular, the spring force of the first spring 110 is higher than the spring force of the second spring 113. Therefore, since the spring force of the first spring 110 exceeds the spring force of the second spring 113, the first spring 110 pushes (against the spring force of the second spring 113) the sliding bar 103, and thus the wedge 116 being part of the sliding bar 103 (to the position) below the retention cage 115 of the heat sink 104 (while contemporaneously compressing the second spring 113). By moving the wedge 116 (to the position) below the retention cage 115 of the heat sink 104, the retention cage 115 of the heat sink 104, as thus the heat sink 104 is lifted. Thereby, the slot 105 is opened (widened) enabling ("zero-force") insertion of the pluggable module 106 into and/or extraction of the pluggable module 106 out of the slot 105, and thus into and/or out of the apparatus 100, respectively. Again, it should be noted that the second spring 113 is compressed (and gets thereby into said "previously compressed" state mentioned above) by the wedge 116 being pushed in a position under (below) the retention cage 115 of the heat sink 104. In other words (and for short), in the example embodiments described with reference of FIGS. 1 to 3, expansion of the first spring 110 causes compression of the second spring 113.

After having described in detail the apparatus 100 according to the first option of the first aspect of the present disclosure, in the following the apparatus 100 according to the second option of the first aspect of the present disclosure will be described.

Figure 4:
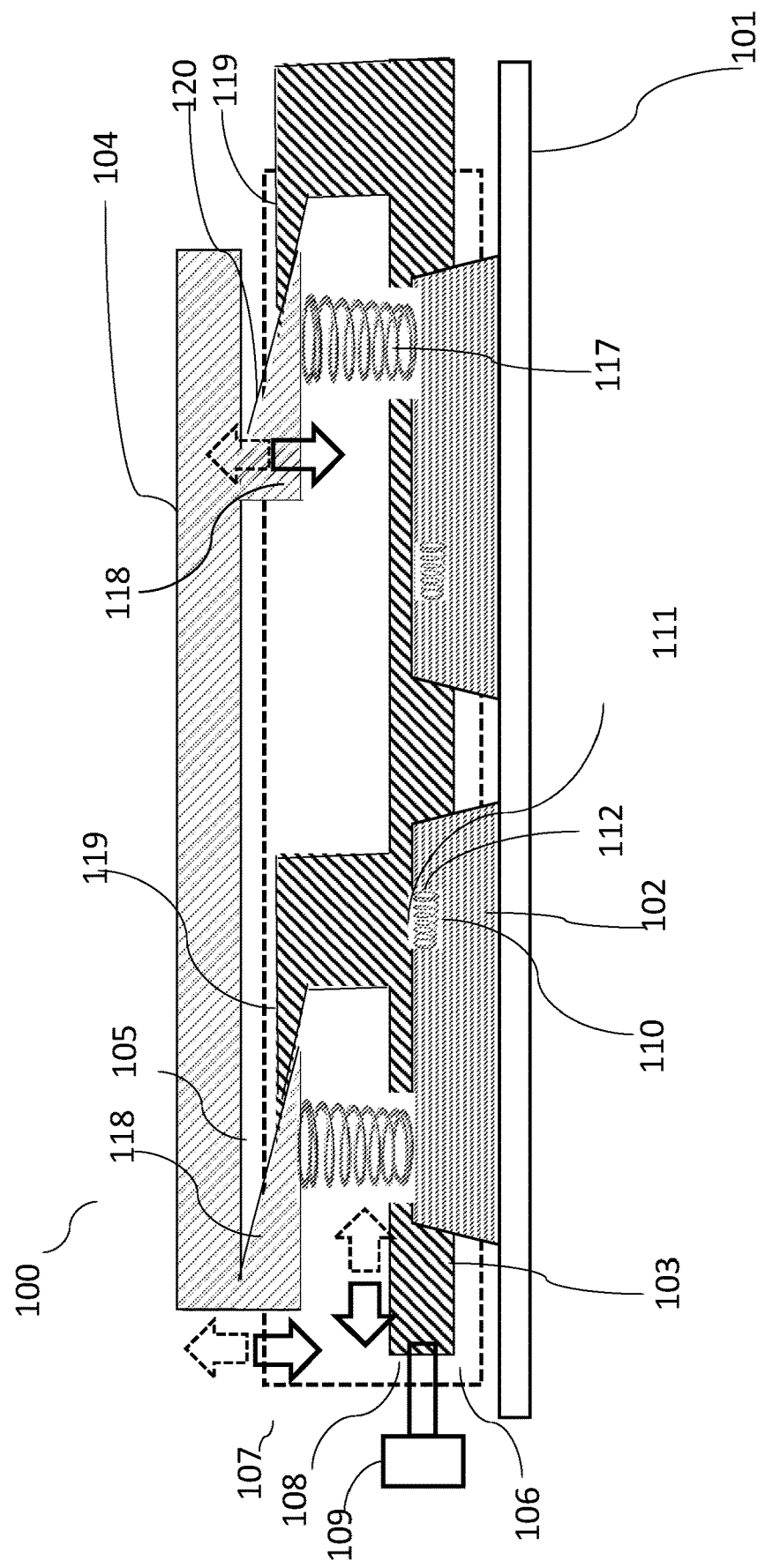
FIG. 4 schematically depicts a cross-section side view of an apparatus according to a second option of the first aspect of the disclosure.

FIG. 4 schematically depicts a cross-section side view of the apparatus 100 according to the second option of the first aspect of the disclosure.

The exemplary apparatus 100 according to the second option of the first aspect is in regard of some elements similar to the apparatus 100 according to the above-described apparatus 100 according to the first option of the first aspect. Therefore, the common features are described (only) briefly in regard of the apparatus 100 according to the second option of the first aspect. For more details in regard of these features, it is referred to the more detailed description of the corresponding features (having the same reference signs) described in the context of the apparatus 100 according to the first option of the first aspect.

As depicted in FIG. 4, the apparatus 100 comprises a base plate 101, a guide rail 102, a sliding bar 103 and a heat sink 104. The guide rail 102 is disposed on the base plate 101. The sliding bar 103 is disposed on the guide rail 102. The base plate 101 and the heat sink 104 form a slot 105 for a pluggable module 106 for insertion of the pluggable module 106 at a front 107 of the slot 105. As illustratively depicted in FIG. 4, the sliding bar 103 comprises an aperture 108 for a thumb screw 109. By screwing the thumb screw 109 into the aperture 108 (in particular, by screwing the outer thread of the thumb screw 109 into the inner thread of the aperture 108), the sliding bar 103 is pulled to the front 107, whereas screwing the thumb screw 109 out of the aperture 108 (thereby opening the thumb screw 109) causes the sliding bar 103 to be pushed away from the front 107. As illustrated in FIG. 4, the sliding bar 103 and the guide rail 102 are connected via a first spring 110. The first spring 110 is horizontally positioned between a protuberance 111 of the sliding bar 103 and a cavity 112 of the guide rail 102. Pulling the sliding bar 103 to the front 107 causes the first spring 110 to be compressed. Screwing the thumb screw 109 out of the aperture 108 allows the first spring 110 to extend. Extension of the first spring 110 causes the sliding bar 103 to be pushed away from the front 107.

Similarly as described in context of the apparatus 100 according to the first option of the first aspect, the apparatus 100 according to the second option of the first aspect might have one or more of the above elements which are described only with regard to the singular form in the plural form, in particular such as depicted in FIG. 4, and the description given in regard of a singular element applies analogously each of the similar element. For example, the apparatus depicted in FIG. 4 comprises the first spring 110 two times, and the description in regard of first spring 110 in the singular form, applies analogously to each of the first spring 110 which are actually implemented.

Still similar to the apparatus 100 according to the first option of the first aspect, the apparatus 100 according to the second option of the first aspect comprises a second spring, wherein the guide rail 102 and the heat sink 104 are connected via said second spring. However, the second spring of the apparatus 100 of the second option of the first aspect is implemented differently from the second spring 113 of the apparatus 100 according to the first option of the first aspect, and therefore the second spring of the apparatus 100 according to the second option of the first aspect is given the reference sign 117 (thus differently from the reference sign 113 of the second spring 113 of the apparatus 100 of the first option of the first aspect).

Further, similarly as the apparatus 100 according to the first option of the first aspect, the apparatus 100 according to the second option of the first aspect comprises a wedge being part of the sliding bar 103. However, the wedge of the sliding bar 103 of the apparatus of the second option of the first aspect is differently implemented from the wedge of the apparatus according to the first option of the first aspect. Therefore, the wedge of the sliding bar 103 of the apparatus 100 of the second option of the first aspect is given a different reference sign (differently from the reference sign 116 of the wedge 116 of the apparatus according to the first option of the first aspect), and is indicated in the context of the apparatus 100 of the second option of the first aspect as wedge 119. Alternatively, the wedge 119 of the sliding bar 103 of the apparatus 110 of the second option of the first aspect might be termed "wedge-shaped protuberance 119", or further alternatively, "wedge-shaped protrusion 119".

Thus, in the following, it will be described in more detail, how the apparatus 100 illustrated in FIG. 4 functions (in particular in regard of the elements which function differently from the above-described functioning, while some functioning might still be similar, as it will be apparent from the following description).

The heat sink 104 has a ramp-shaped protuberance 118 at the lower side of the heat sink 104 (this means on the side facing the sliding bar 103). Alternatively to the term "ramp-shape protuberance 118", the ramp-shape protuberance 118 might be termed "wedge 118" or—preferably—more precisely "wedge 118 of the heat sink 104". However, since using the term "wedge" both for the wedge 119 of the sliding bar 103 and for the wedge 118 of the heat sink might be confusing and/or would make understanding of the description more difficult, the term "ramp-shaped protuberance 118" is used, in particular in the following detailed description. The second spring 117 is vertically positioned between the guide rail 102 and a lower surface of the ramp-shaped protuberance 118 of the heat sink 104. Further, as mentioned already above, the sliding bar 103 comprises wedge 119 on the upper surface of the sliding bar 103 (this means on side facing the heat sink 104). Both, the ramp-shaped protuberance 118 of the heat sink 104 and the wedge 119 of the sliding bar 103 have a respective planar surface and an inclined surface (such as shown in FIG. 4). However, at the ramp-shaped protuberance 118 the planar surface is on the lower side and the inclined surface is on the lateral upper side (and is denoted as lateral surface 120), and makes the ramp-shaped protuberance 118 become thicker from the lower side to the upper side, whereas at the wedge 119 of the sliding bar 103 the planar surface is on the upper side and the inclined surface is on the lateral lower side of the wedge 119 and makes the wedge 119 become thinner from the lower side to the upper side (see FIG. 4).

Further, the inclined surface of the wedge 119 is faced toward the inclined surface of the ramp-shaped protuberance 118. Further, the inclined surface of the wedge 119 is adapted to slide along the inclined surface of the ramp-shaped protuberance 118, when the sliding bar 103 is moved sideward.

In particular, pulling the sliding bar 103 to the front 107 causes the wedge 119 of the sliding bar 103 to be pulled over the lateral (inclined) surface 120 of the ramp-shaped protuberance 118 of the heat sink 104. Since, the sliding bar 103 is movable in the sideward (horizontal) direction, but not in the vertical direction, and the heat sink 104 is movable in the horizontal direction (but not in the sideward direction), by pulling the wedge 119 of the sliding bar 103 over the ramp-shaped protuberance 118 of the heat sink 104 (causing the portion of ramp-shaped protuberance 118 and the portion of wedge 119 which thereby overlap become thicker) the ramp-shape protuberance 118 is pulled downward. Since the ramp-shaped protuberance 118 of the heat sink 104 is part of the heat sink 104, pulling the ramp-shaped protuberance 118 downward means pulling the heat sink 104 downward. The heat sink 104 is pulled downward, until the heat sink 104 gets into close contact with the upper surface of the pluggable module 106, which has been inserted into the slot 105.

In summary, the functioning of the apparatus 100 depicted in FIG. 4 can be summarized so far as follows. The pluggable module 106 is inserted into the slot 105. The thumb screw 109 is screwed (in particular through a hole of the front plate (not depicted) of the pluggable module 106) into the aperture 108. Screwing the thumb screw 109 into the aperture 108 pulls the sliding bar 103 (against the force spring of the first spring 110) to the front 107 (illustrated in FIG. 4 by the arrow in bold depicted above the sliding bar 103 at the front 107 of the slot 105). Thereby, the wedge 119 of the sliding bar 103 slides over the ramp-shaped protuberance 118 of the heat sink 104. Thereby, the heat sink 104 is pulled downward (illustrated in FIG. 4 by the arrows in bold depicted at the ramp-shape protuberance 118 of the heat sink 104), thereby the heat sink 104 gets in close contact with the pluggable module 106. Thereby, heat transfer from the pluggable module 106 to the heat sink 104 is enabled. In this context, it should be noted, that pulling the heat sink 104 downward causes the second spring 117 to be compressed.

After having described how the pluggable module 106 is mounted into the slot 105 and thus into the apparatus 100, and how the heat sink 104 is brought into close contact with the inserted pluggable module 106, in the following, it will be described, how the pluggable module 106 is extracted out of the slot 105, in particular how the extraction is facilitated, namely by lifting the heat sink 104 thereby opening (widening) the slot 105.

When the pluggable module 106 is to be extracted, the thumb screw 109 is screwed out of the aperture 108 (in other words, the thumb screw 109 is opened). When the thumb screw 109 is screwed out of the aperture 108, the first spring 110 is allowed to extend (or in other terms "to be extended", or "to expand"). Extension of the first spring 110 causes the sliding bar 103 to be pushed away from the front 107. In FIG. 4, the sliding bar 103 is by the spring force of the extending first spring 110 pushed to the right side. It should be remembered that the sliding bar 103 is sideward movable disposed on the guide rail 102, whereas the guide rail 102 is fixed to the base plate 101 and the guide rail 102 is not movable. As can be appreciated from FIG. 4, when the sliding bar 103 is pushed away from the front 107 (to the right side in FIG. 4), the wedge 119 of the sliding bar 103 is pushed away from the lateral inclined surface 120 of the ramp-shaped protuberance 118 of the heat sink 104. Thereby, the portion of the wedge 119 and the portion of the ramp-shaped protuberance 118 which overlap become thinner. Thereby, the ramp-shaped protuberance 118 gets more room to manoeuvre, this means more room to move in the vertical, in particular upper, direction. It should be kept in mind that the second spring 117 is positioned under the lower planar surface of the ramp-shaped protuberance 118 and the second spring 117 has previously been compressed (during the insertion process described above). This means, the second spring 117 is in a compressed state and constantly pushes from downward against the lower planar side of the ramp-shaped protuberance 118. As soon as the sliding bar 103 is pushed sideward and the wedge 119 of the sliding bar 103 is pushed away into the direction away from the ramp-shaped protuberance 118, and thus the ramp-shaped protuberance 118 and the wedge 119 overlap less and less, giving the ramp-shaped protuberance 118 more room to manoeuvre (in particular upward), the spring force of the (previously compressed) second spring 117 pushes the ramp-shaped protuberance 118 and thus the heat sink 104 upward. In other words, pushing the sliding bar 103 away from the front 107 allows the second spring 117 to extend (or in other terms "to expand", or "to be extended") thereby causing the heat sink 104 to be lifted thereby opening the slot 105 enabling (facilitated) extraction of the pluggable module 106 out of the slot 105.

Thus, the extraction process in regard of the exemplary apparatus 110 in FIG. 4 might be summarized as follows: the thumb screw 109 is opened, this means screwed out of the aperture 108. The spring force of the (previously compressed) first spring 110 pushes the sliding bar 103 away from the front 107 (illustrated in FIG. 4 by the arrow in broken line depicted above the sliding bar 103 at the front 107 of the slot 105). The wedge 119 of the sliding bar 103 moves in the direction away from the ramp-shaped protuberance 118 of the heat sink 104 giving the ramp-shape protuberance 118 of the heat sink 104 and thus the heat sink 104 more room to manoeuvre, namely vertically upward allowing the (previously compressed) second spring 117 to push the heat sink 104 upward (illustrated in FIG. 4 by the arrows in broken line depicted at the ramp-shave protuberance 118 of the heat sink 104) thereby opening the slot 104 for (facilitated) extraction of the pluggable module 106.

It should be underlined that the inclined implementation of the wedge 119 and of the ramp-shaped protuberance 118 allows the sliding bar 103 to move smoothly sideward until the heat sink 104 gets in close contact with the inserted pluggable module 106. The bigger the height of a pluggable module 106, the less the wedge 119 will get over the ramp-shaped protuberance 118. This is, because once the heat sink 104 is in contact with the pluggable module 106 inserted into the slot 105, the sliding bar 103 cannot be moved sideward further. This is, because (as soon as the heat sink 104 gets in contact with the inserted pluggable module 106) the heat sink 104 and therefore the ramp-shaped protuberance 118 cannot get downward further. Therefore, at that moment, the wedge 119 cannot slide further over the ramp-shaped protuberance 118. In other words, by this inclined implementation of the wedge 119 and the inclined implementation of the ramp-shaped protuberance 118, the apparatus 100 fits for different pluggable modules 106 having different heights. Depending on the height, the heat sink 104 will be moved downward more or less (until the heat sink 104 gets in close contact with the inserted pluggable module 106 enabling heat transfer from the pluggable module 106 to the heat sink 104). This (advantage of the present disclosure) is enabled by the smooth sideward movement of the sliding bar 103 and by the smooth downward movement of the heat sink 104 enabled by the (face-to-face) inclined implementation of the wedge 119 and the ramp-shaped protuberance 118.

Conclusively, it might be stated that differences between the first option of the first aspect and the second option of the first aspect are in particular:

In the first option of the first aspect, the heat sink 104 is pushed upward by the wedge 116 of the sliding bar 103 when the wedge 116 is moved to the position below the second spring 113, thereby compressing the second spring 113. The heat sink 104 is pushed downward by the second spring 113 as soon as the wedge 116 is moved in direction away from the position where the second spring 113 is disposed.

In the second option of the first aspect, the ramp-shaped protuberance 118 of the heat sink 104, and thus the heat sink 104 is pulled downward by the wedge 119 of the sliding bar 103 thereby compressing the second spring 117. The heat sink 104 is pushed upward by the previously compressed second spring 117, as soon as the wedge 119 of the sliding bar 103 is moved in direction away from the ramp-shaped protuberance 118 of the heat sink 104.

Figure 5:
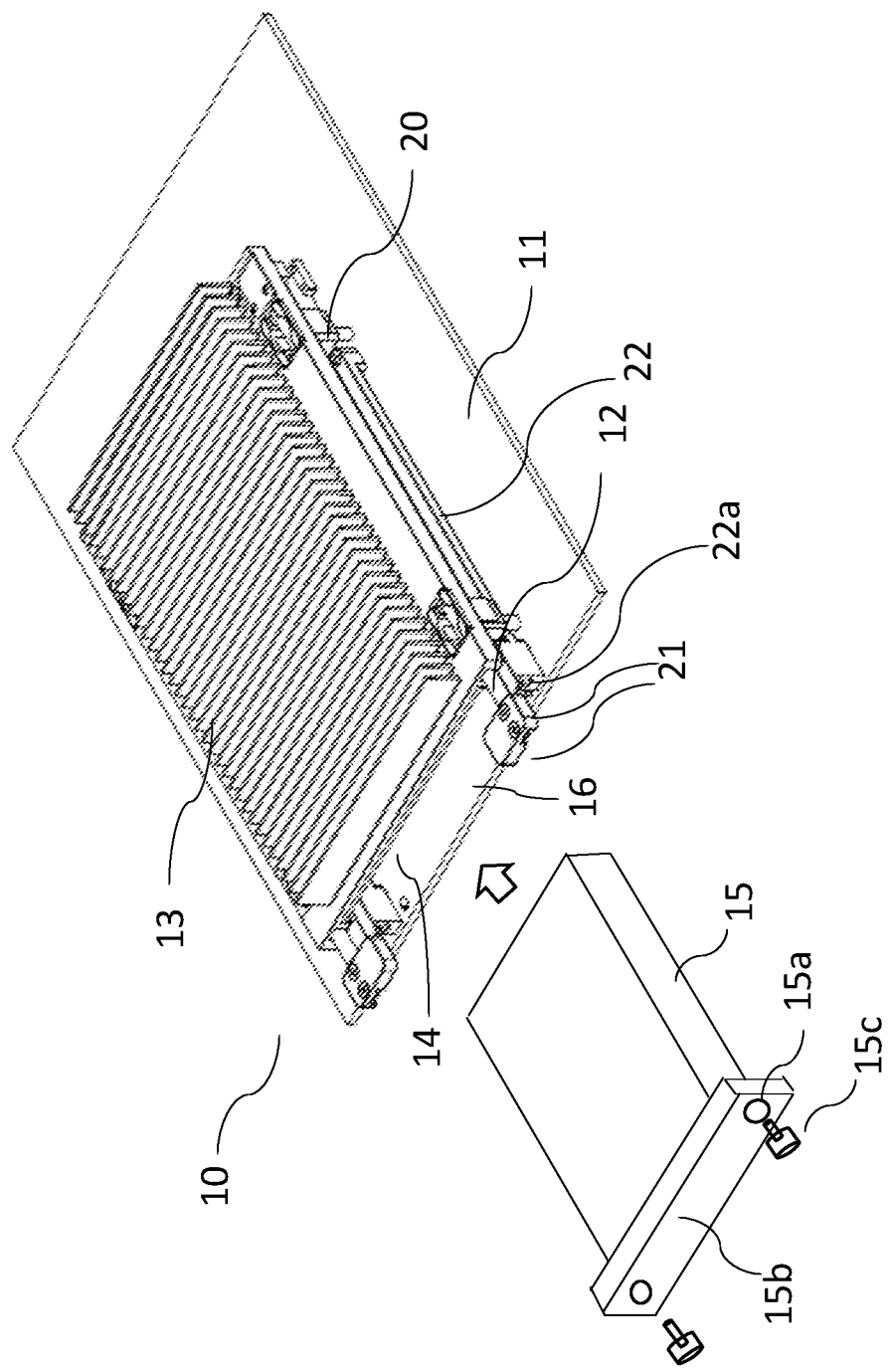
FIG. 5 schematically depicts a perspective view of an apparatus according to a second aspect of the disclosure.
Figure 6:
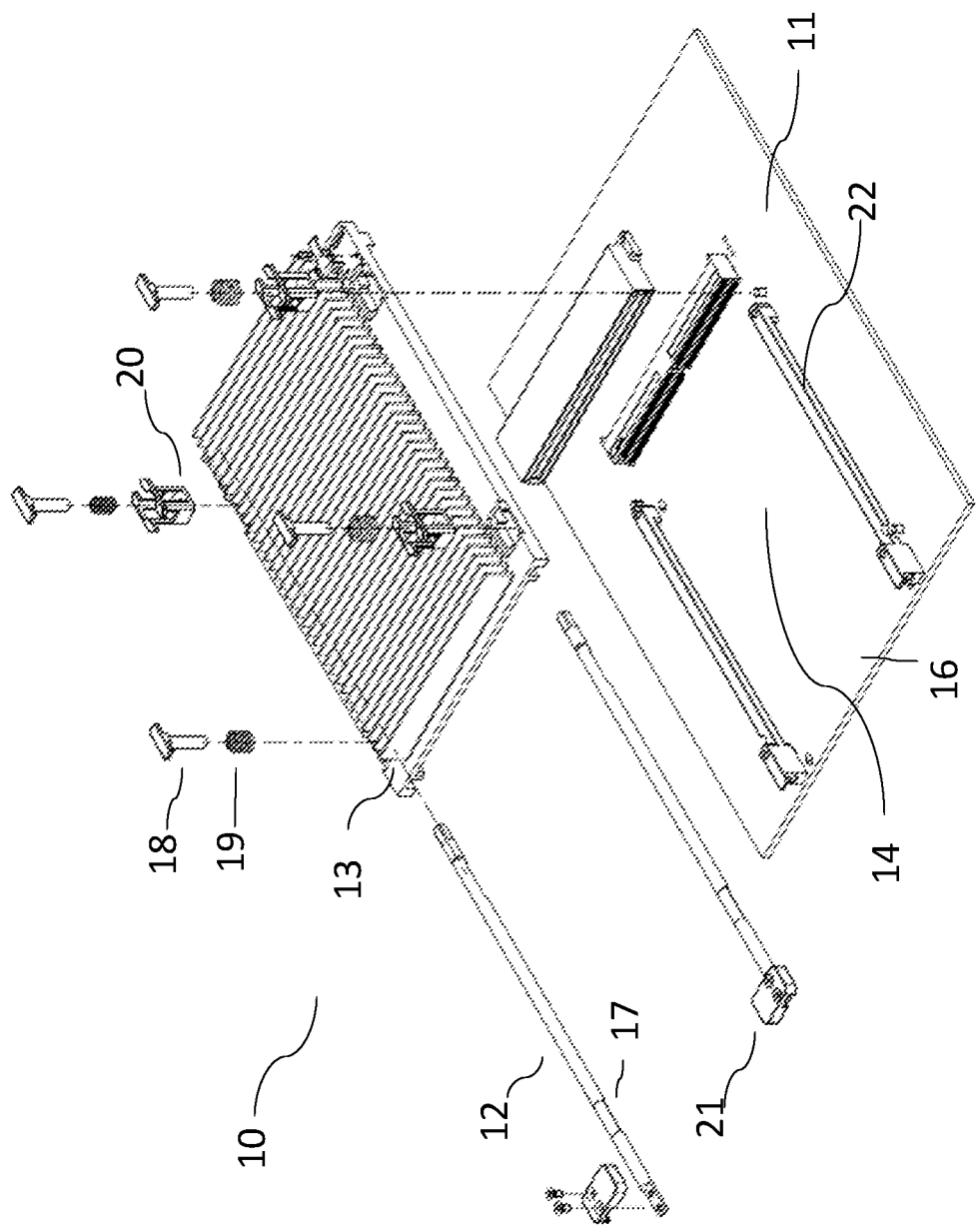
FIG. 6 schematically depicts a perspective, exploded view of an apparatus according to the second aspect of the disclosure.
Figure 7:
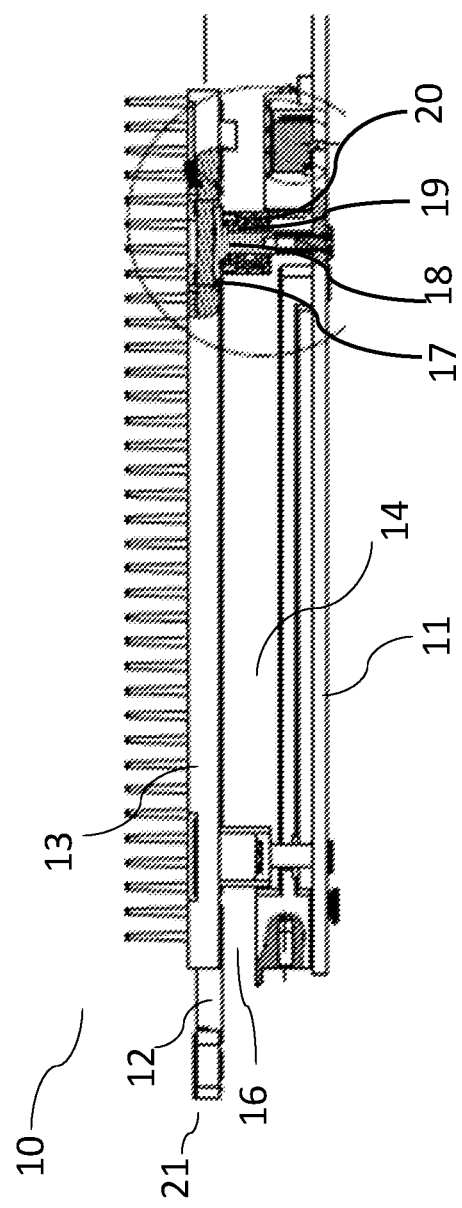
FIG. 7 schematically depicts a cross-section side view of an apparatus according to the second aspect of the disclosure.
Figure 8:
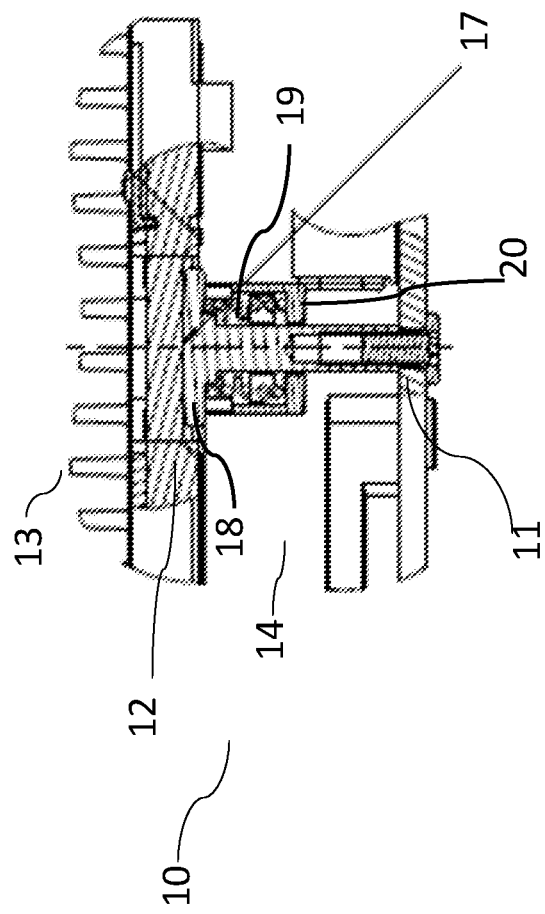
FIG. 8 schematically depicts a partial cross-section side view of an apparatus according to the second aspect of the disclosure.
Figure 9:
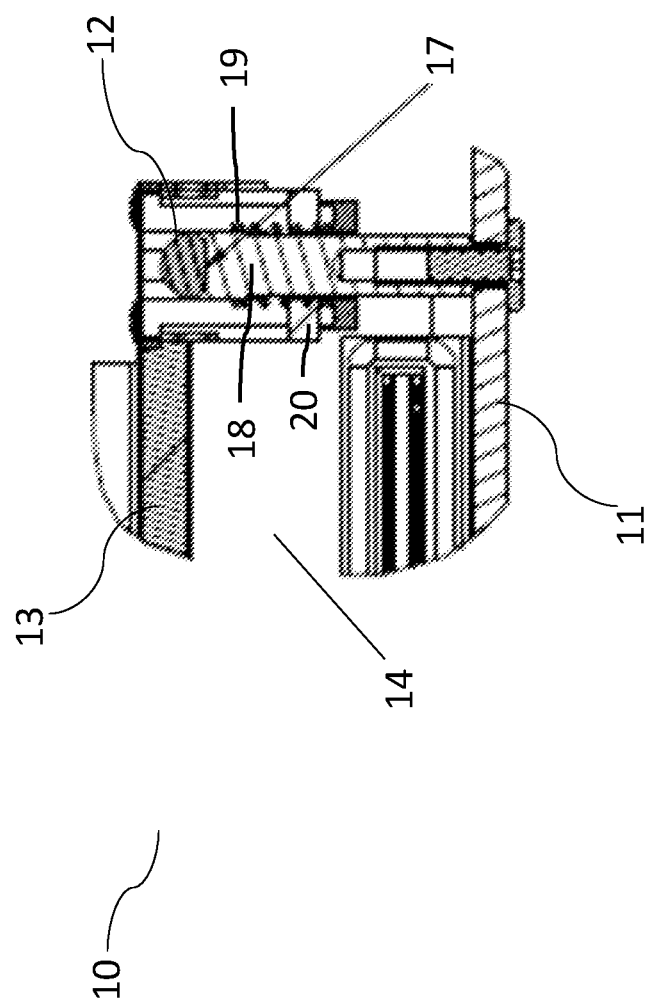
FIG. 9 schematically depicts a further partial cross-section side view of an apparatus according to the second aspect of the disclosure.

After having described the apparatus 100 according to the (first and second option of the) first aspect of the disclosure, in the following, an apparatus 10 according to a second aspect of the disclosure will be described with reference to FIGS. 5 to 9. Since some elements of the apparatus 10 are shown only or at least better in only one or some of FIGS. 5 to 9, the reader may refer to FIGS. 5 to 9 in parallel. FIGS. 5 and 6 schematically depict a perspective view, wherein FIG. 6 is an exploded view, FIG. 7 schematically depicts a cross-section side view and FIGS. 8 and 9 schematically depict a partial cross-section side view of apparatus 10.

As can be seen e.g., on FIGS. 5 and 6, the apparatus 10 comprises a base plate 11, a rod 12 and a heat sink 13. More specifically, in the particular implementation of FIGS. 5 and 6, the apparatus 10 comprises two rods 12, namely on the lateral right side and on the lateral left side. However, since the principle functioning of an apparatus 10 might theoretically be possible with only one rod 12, only one rod 12 has been defined in the claims, and the further description relates basically to a rod 12 in the singular form. For example, in case of implementing only one rod 12 on one lateral side, on the other lateral side, some kind of hinges might be implemented allowing that the heat sink 13 is movable in the sense that the heat sink 13 is rotatable fixed by said hinges on one lateral side and is lifted by the rod 12 on the other lateral side. In case of the implementation of two rods 12, the description applies analogously to both of the rods 12. In this latter case, the heat sink 13 is lifted by means of the two rods 12 at each lateral side. The lifting of the heat sink 13 by a rod 12 will now be described in detail and applies to a one-rod-implementation and to a two-rod-implementation analogously.

Although FIG. 6 is an exploded presentation of the apparatus 10, when looking at the left side ("left" side from the perspective of the front 16) of the apparatus 10, it is depicted by the broken lines between the rod 12 and the heat sink 13 that—once the apparatus 10 is assembled—the heat sink 13 is disposed on the rod 12. Further, as it might be seen e.g., in FIG. 5, the heat sink 13 and the base plate 11 form a slot 14 for mounting a pluggable module 15 into the slot 14. FIG. 5 might depict how the apparatus 10 looks before the pluggable module 15 is inserted, wherein the arrow between the pluggable module 15 and the apparatus 10 shows in which direction the pluggable module 15 will be inserted into the slot 14. The apparatus 10 will look similarly once the pluggable module 15 is inserted (and mounted) into the apparatus 10, but then—in contrast to the presentation in FIG. 5—with the pluggable module 15 into the apparatus 10. Further, the pluggable module 15 once inserted into the apparatus 10 might be fixed by screws. Therefore, as shown in FIG. 5, the pluggable module 15 might have holes 15a at the front plate 15b of the pluggable module 15 and the apparatus 10—or more specifically a guide rail 22 (e.g., one guide rail 22 on each lateral side) of the apparatus 10—might have an aperture 22a for fixation of a screw 15c which would be screwed through the hole 15a of the front plate 15b and into the ((inner thread of the) aperture 22a of the guide rail 22 of the) apparatus 10. The screw 15c might be implemented as a thumb screw 15c in order to facilitate the handling. However, this screw 15c is not part of the lifting mechanism in the apparatus 10 (differently from the thumb screw 109 of the apparatus 100 described above), but is (only) for fixation of the pluggable module 15 into the apparatus 10.

In the apparatus 10, the heat sink 13 is lifted by turning the rod 12 around its longitudinal axis. By lifting the heat sink 13 the slot 14 is opened (widened) and (facilitated) insertion and/or extraction of the pluggable module 15 at the front 16 of the slot 14 is enabled. For enabling turning the rod 12 (or at least making turning the rod 12 easier), the rod 12 has a knob 21 at its front end of the rod 12. It should again be emphasized that the knob 21 of apparatus 10 is not for fixation of the pluggable module 15, but for turning the rod 12 causing the lifting mechanism.

As said, when the rod 12 is turned around its longitudinal axis, the heat sink 13 which is disposed on the rod 12 is lifted (or—depending on how the rod 12 is turned—caused to move downward from the lifted position). Coarsely spoken, the reason for that the heat sink 13 is lifted when the rod 12 is turned is that the thickness of rod 12 at the position where the heat sink 13 is positioned on the rod 12 changes depending on in which direction (or to which position) the rod 12 is turned. This will now be explained in more detail.

As it can be seen in FIG. 6, the rod 12 comprises a section including a cam 17. The cam 17 reduces a cross-sectional area of the rod 12. In FIG. 9, the rod 12 is depicted in a cross-section view. In FIG. 9, it can be seen that by the cam 17, a part of the rod 12 is cut off so that the cross-section is not a full circle (as is would be, if there were no cam), but one side of the cross-section (the lower side in FIG. 9) is planar. Therefore, when the rod 12 is turned, until the cam 17 is on the lower side (e.g., horizontally on the lower side), the cross-section in vertical direction from the lower side of the rod 12 to the upper side of the rod 12 is reduced. This means, the vertical cross-section is then (because of the cam 17) less than the vertical cross-section would be if there were no cam 17 at all, or if the rod 12 were turned such that the cam 17 is on a lateral side (right or left) of the cross-section view of the rod 12 and did therefore not reduce the vertical cross-section of the rod 12 measured from the lowest point to the highest point of the cross section. Thus, when the rod 12 is turned until the cam 17 is on the lowest position, the heat sink 13 is on the lowest position of the heat sink 13 (not lifted), and when the rod 12 is turned until the cam 18 is on a lateral side, the heat sink 13 is on its highest position (lifted). This is now described in even more detail.

As depicted in enlarged view in FIG. 9, at the section including the cam 17 the rod 12 is disposed on a spring seat 18 of the base plate 11. Alternatively to the term "spring seat", the term "spring holder" may be used. Illustratively, the spring seat 18 of the base plate 11 is fixed with a kind of fixation screw with the base plate 11. However, how the spring seat 18 is fixed on the base plate 11 is not of particular importance for the functioning of the lifting mechanism (and another fixation might be implemented) and is not further detailed here. In FIG. 8, which is a partial portion of FIG. 7 and which shows a cross-sectional view from the side (whereas FIG. 9 is a cross-sectional view from the front), it can be appreciated, that the spring seat 18 might be T-shaped (in the illustrative implementation/presentation of FIG. 8), and looks from this perspective like a (capital) "T". This can also be seen on FIG. 6, depicting the spring seat 18 (having exemplarily a T-shape) in the exploded view, more specifically four spring seats 18, namely one at each edge of the apparatus 10. The spring seat 18 is termed "spring seat 18", because it holds a spring in the sense that the spring loops (or entangles) around the spring seat 18, as will be described in more detail in the following.

As it can be seen by looking e.g., on FIGS. 6, 8 and 9, a spring 19 is disposed between the spring seat 18 of the base plate 11 and a retention cage 20 for the spring 19, wherein the retention cage 20 is part of the heat sink 13. For example (as in the illustrative implementation and presentation in FIG. 6), the retention cage 20 might have the form of a pair 20 of an L-shaped protuberance and of a mirrored L-shaped protuberance, and might have this L-shaped/mirrored L-shaped appearance both from the lateral cross-section view of FIG. 8 and the front cross-section view of FIG. 9.

Between the spring seat 18 of the base plate 11 and the retention cage 20 of the heat sink 13 the spring 19 is disposed.

In more detail, the retention cage 20 forms (kind of) a cage into which the spring 19 and the spring seat 18 are disposed. The reader might refer in particular to FIGS. 6 and 9 which show the spring 19 disposed into said cage and around the spring seat 18, namely around the vertical part of the spring seat 18. For example, when looking from the side as in FIGS. 6, the spring seat 18 might have the shape of a "T", then the spring 19 is disposed around the vertical part of the "T". Further, the spring seat 18 might have a horizontal part, which might for example have the shape of the horizontal part of a "T". Thereby the spring 19 is positioned between the lower side of the horizontal part of the spring seat 18, for example illustratively between the lower side of the horizontal part of the "T" of spring seat 18, and the inner lower side of the retention cage 20 of the heat sink 13.

It should be reminded that the spring seat 18 is not movable, in contrast to the retention cage 20 which is part of the heat sink 13 and which is movable similar as the heat sink 13 is movable, in particular in the vertical direction.

As it might be seen in FIGS. 8 and 9, when the heat sink 13 is lifted, the retention cage 20 is lifted. Thereby, the retention cage 20 (namely the inner lower part of it) pushes against the spring 19 (from down to upward). Since the spring 19 on its upper side is mounted under the lower side of the horizontal part of the spring seat 18 (for example illustratively under the lower side of the horizontal part of the "T" in case of a "T-shaped" spring seat 18) and since the spring seat 18 is not movable, by lifting the heat sink 13 and therefore lifting the retention cage 20 the spring 19 is compressed. This means, lifting the heat sink 13 is made against the spring force of the spring 19. Inversely, as soon as the first spring 19 is allowed to extend (or in other words to expand, or to be extended), the (spring force of the previously compressed) first spring 19 pushes the heat sink 13 downward and causes the heat sink 13 to get in close contact with a pluggable module 15 (which has been inserted into apparatus 10).

In the exemplary apparatus 10, the knob 21 of the rod 12 is not only used just to turn the rod 12. Further, the knob 21 indicates the position to which the rod 12 is turned, thereby indirectly indicating the position of the cam 17. Thus, for lifting the heat sink 13, the rod 12 (e.g., by means of the knob 21) is turned around its longitudinal axis until the knob 21 points to a first direction (for example vertically downward, or alternatively vertically upward). By turning the rod 12 to this position, the cam 17 of the rod 12 is at a lateral position, e. g., on the right side or the left side of the cross-section of the rod 12. Thereby, see e.g., FIG. 9, the (vertical) thickness of the rod is (increased up to) the full-cross section of the rod 12 (as if there were no cam 17), at the position where the rod 12 is disposed on spring seat 18 of the base plate 11. Thereby, the retention cage 20 is lifted and the heat sink 13 is lifted. Thereby, the slot 14 is opened (widened) enabling (facilitated) insertion and/or extraction of the pluggable module 15 at the front 16 of the slot 14. Again, it is noted that by lifting the heat sink 13, the spring 19 is compressed.

After the pluggable module 15 is inserted into the slot 14, for bringing the heat sink 13 in close contact with the pluggable module 15 allowing heat transfer from the pluggable module 15 to the heat sink 13, the rod 12 (e.g., by means of the knob 21) is turned around its longitudinal axis until the knob 21 points to a second direction (e.g., horizontally inwards such as depicted in FIG. 6, e.g. at the rod 12 on the right lateral side, the knob 21 points to the left). When the rod 12 is turned to said position, the cam 17 is at a lower position thereby decreasing the thickness of the rod 12 where the rod 12 is disposed on the spring seat 18 of the base plate 11 such as depicted for example in FIG. 9. The thickness of the rod 12 (see FIG. 3) at that position might be reduced by the full depth of the cam 17, in other words, up to a thickness corresponding to the full cross-sectional area of the rod 12 minus a depth of the cam 17. As described also above in the context of FIG. 9, thereby the spring 19 is allowed to extend. When the spring 19 is allowed to extend, the (spring force of the previously) compressed spring 19 pulls the heat sink 13 downward. Thereby, the heat sink 13 gets in close contact with an upper surface of the pluggable module 15 being inserted into the slot 14.

Further, it is noted that, as an alternative, the knob 21 might be implemented in a position on the rod 12 such that the knob 21 points horizontally when the heat sink 13 is lifted. For example, the knob 21 of the rod 12 at the left lateral side of the apparatus 10 might be in a horizontal direction inward, and the knob 21 of the rod 12 at the right lateral side of the apparatus 10 might be in a horizontal direction inward. In this case, FIG. 6 might be regarded as to show the heat sink 13 in the lifted position. Further, in this implementation, the knob 21 might be directed vertically downward, when the rod 12 is turned to get the heat sink 13 downward. This means, in this implementation, the first direction (of the knob 21) to which the rod 12 is turned to lift the heat sink 13 is "horizontally inwards", whereas the second direction (of the knob 21) to which the rod 12 is turned to get the heat sink 13 downward in close contact with the pluggable module 15 is "vertically downward".

Conclusively, example embodiments of the disclosure provide an apparatus with a heat sink for mounting a pluggable module into the apparatus and disclose solutions how insertion and/or extraction of the pluggable module is facilitated by lifting the heat sink such as described in example embodiments.

The pluggable module might be an optical module, e.g., a CFP (C-Form-Factor-Pluggable) module, a SFP (Small Form-Factor Pluggable) module or QSFP (Quad Small Form Factor Pluggable) module. The apparatus might be part of a telecommunication subrack.

It will be appreciated that, although various example embodiments which incorporate the teachings presented herein have been shown and described in detail herein, those skilled in the art can readily devise many other varied example embodiments that still incorporate these teachings. Although the various example embodiments have been described in detail with particular reference to certain exemplary facets thereof, it should be understood that the teaching is capable of other example embodiments and its details are capable of modifications in various obvious respects. As is readily apparent to those skilled in the art, variations and modifications can be implemented while remaining within the scope of the disclosure. Accordingly, the foregoing disclosure, description, and drawings are for illustrative purposes only and are have no restrictive character. The scope of the disclosure is defined by the attached claims.

The invention claimed is:

1. An apparatus comprising;
a base plate;
a guide rail being disposed on the base plate;
a sliding bar with a first side being disposed on the guide rail, wherein the sliding bar includes a wedge on a second side of the sliding bar opposite the first side; and
a heat sink rotatably connected to the base plate,
wherein the base plate and the heat sink form a slot for insertion of a pluggable module at a front of the slot;
further comprising at least one hinge coupled to the base plate and to the heat sink; and
wherein the sliding bar comprises an aperture with an internal thread for a thumb screw, wherein screwing the thumb screw into the internal thread of the aperture causes the sliding bar to be pulled towards the front of the slot.

2. An apparatus comprising:
a base plate;
a guide rail being disposed on the base plate;
a sliding bar with a first side being disposed on the guide rail, wherein the sliding bar includes a wedge on a second side of the sliding bar opposite the first side; and
a heat sink,
wherein the base plate and the heat sink form a slot for insertion of a pluggable module at a front of the slot,
wherein the sliding bar comprises an aperture with an internal thread for a thumb screw, wherein screwing the thumb screw the internal thread of the aperture causes the sliding bar to be pulled towards the front of the slot.

3. The apparatus according to claim 2, further comprising a first spring, wherein the sliding bar and the guide rail are configured to be connected via the first spring, the first spring being positioned substantially parallel to an axis along the length of the sliding bar and between a protuberance of the sliding bar and a cavity of the guide rail, and pulling the sliding bar toward the front of the slot causes the first spring to be compressed.

4. The apparatus according to claim 2, wherein opening the thumb screw by screwing the thumb screw out of the aperture, causes the sliding bar to be pushed away from the front of the slot.

5. The apparatus according to claim 3, wherein opening the thumb screw by screwing the thumb screw out of the aperture, allows the first spring to extend, wherein extension of the first spring causes the sliding bar to be pushed away from the front of the slot.

6. The apparatus according to claim 3, further comprising:
a second spring connecting the guide rail and the heat sink,
wherein the second spring being positioned substantially perpendicular to the first spring and between a spring seat of the guide rail and a retention cage of the heat sink, and pulling the sliding bar towards the front of the slot causes the wedge to be moved to a position not being below the retention cage thereby allowing the second spring to be extended, wherein extending the second spring causes the heat sink to be pushed downward causing the heat sink to come into contact with an upper surface of the pluggable module.

7. The apparatus according to claim 6, wherein pushing the sliding bar away from the front of the slot causes the wedge to be moved to a position below the retention cage thereby causing the heat sink to be moved away from the base plate thereby opening the slot and enabling extraction of the pluggable module out of the slot.

8. The apparatus according to claim 3, further comprising:
a second spring connecting the guide rail and the heat sink,
wherein the second spring being positioned substantially perpendicular to the first spring and between the guide rail and a lower surface of a ramp-shaped protuberance of the heat sink, and pulling the sliding bar towards the front of the slot causes the wedge of the sliding bar to be pulled over a surface of the ramp-shaped protuberance of the heat sink thereby pulling the heat sink towards the base plate and causing the heat sink come into contact with an upper surface of the pluggable module.

9. The apparatus according to claim 8, wherein pulling the heat sink towards the base plate causes the second spring to be compressed.

10. The apparatus according to claim 9, wherein opening the thumb screw by screwing the thumb screw out of the aperture allows the first spring to extend, extension of the first spring causes the sliding bar to be pushed away from the front of the slot, pushing the sliding bar away from the front causes the wedge of the sliding bar to be pushed away from the lateral surface of the ramp-shaped protuberance of the heat sink thereby allowing the second spring to extend thereby causing the heat sink to move away from the base plate thereby opening the slot enabling extraction of the pluggable module out of the slot.

11. The apparatus of claim 1, wherein the guide rail is disposed on the base plate at a first lateral side thereof, and the at least one hinge is disposed on the base plate at a second lateral side thereof.

12. The apparatus of claim 1, further comprising a first spring, wherein the sliding bar and the guide rail are configured to be connected via the first spring, the first spring being positioned substantially parallel to an axis along the length of the sliding bar and between a protuberance of the sliding bar and a cavity of the guide rail, and pulling the sliding bar toward the front of the slot causes the first spring to be compressed.

* * * * *